United States Patent [19]

Kim et al.

[11] Patent Number: 5,715,253

[45] Date of Patent: Feb. 3, 1998

[54] ROM REPAIR CIRCUIT

[75] Inventors: Jong Ho Kim, Seoul; Moon Cheol Shin, Kyungki-Do, both of Rep. of Korea

[73] Assignee: LG Semicon Co., Ltd., Cheongju, Rep. of Korea

[21] Appl. No.: 648,452

[22] Filed: May 15, 1996

Related U.S. Application Data

[63] Continuation-in-part of Ser. No. 524,954, Sep. 8, 1995, abandoned, which is a continuation of Ser. No. 146,296, Nov. 4, 1993, abandoned.

[30] Foreign Application Priority Data

Feb. 15, 1993 [KR] Rep. of Korea .............. 2079/1993

[51] Int. Cl.$^6$ .............................................. G06F 11/00
[52] U.S. Cl. .............................................. 371/10.3
[58] Field of Search .............................................. 371/10.3

[56] References Cited

U.S. PATENT DOCUMENTS 3,633,175  1/1972  Harper .................... 371/10.2
4,890,286  12/1989  Hirose .
5,200,959  4/1993  Gross et al. ............. 371/10.2

*Primary Examiner*—Vincent P. Canney
*Attorney, Agent, or Firm*—Fleshner & Kim

[57] ABSTRACT

A ROM repair circuit comprising a ROM cell array having a plurality of cells, each of the cells storing information inputted through a corresponding one of a plurality of bit lines under a control of data inputted through a corresponding one of a plurality of word lines, column and row address detectors for detecting column and row addresses corresponding to a failed one of the cells in the ROM cell array from addresses applied in a test mode and generating error detect signals in accordance with the detected results, respectively, and column and row address converters responsive to the error detect signals from the column and row address detectors to replace the column and row addresses corresponding to the failed one of the cells in the ROM cell array with different column and row addresses corresponding to a different one of the cells in the ROM cell array in which is stored the same information as normal information stored in the failed cell prior to the failure.

4 Claims, 4 Drawing Sheets

1

ROM REPAIR CIRCUIT

This application is a continuation in part of application Ser. No. 08/524,954 filed Sep. 8, 1995, (now abandoned) which is a continuation of application Ser. No. 08/146,296, filed Nov. 4, 1993, (now abandoned).

BACKGROUND OF THE INVENTION

1. Field of the Invention

The present invention relates in general to read only memory (ROM) repair circuits, and more particularly to a ROM repair circuit for replacing an address corresponding to a failed cell with a different address corresponding to a different cell in which is stored the same information as normal information stored in the failed cell prior to the failure, so that the normal information can be accessed from the cell corresponding to the replaced address.

2. Description of the Prior Art

Referring to FIG. 1, there is shown a block diagram of a conventional ROM repair circuit. As shown in this drawing, the conventional ROM repair circuit comprises a ROM cell array 1 having a plurality of cells each for storing information inputted through a corresponding one of a plurality of bit lines under a control of data inputted through a corresponding one of a plurality of word lines.

A row address detector 2 is provided in the conventional ROM repair circuit to detect a row address corresponding to a failed one of the cells in the ROM cell array 1 from addresses A1–An and $\overline{A1}$–$\overline{An}$ applied in a test mode and generate an error address detect signal EADX in accordance with the detected result.

A column address detector 3 is also provided in the conventional ROM repair circuit to detect a column address corresponding to the failed one of the cells in the ROM cell array 1 from the addresses A1–An and $\overline{A1}$–$\overline{An}$ applied in the test mode and generate an error address detect signal EADY in accordance with the detected result.

The conventional ROM repair circuit also comprises a row redundancy cell array 4 for repairing the information stored in the failed one of the cells in the ROM cell array 1 in response to the error address detect signal EADX from the row address detector 2 and a column redundancy cell array 5 for repairing the information stored in the failed one of the cells in the ROM cell array 1 in response to the error address detect signal EADY from the column address detector 3.

Referring to FIG. 2, there is shown a detailed circuit diagram of the redundancy cell arrays 4, 5 in the conventional ROM repair circuit in FIG. 1. As shown in this drawing, the redundancy cell arrays 4, 5 includes the plurality of cells RC1–RCn, each of which stores the information inputted through the corresponding one of the bit lines BL1–BLn under the control of the data inputted through the corresponding one of the word lines WL1–WLn. Each of the cells RC1–RCn includes a corresponding one of fuses F1–Fn and a corresponding one of NMOS transistors MN1–MNn, each of which has a gate connected to a corresponding one of the word lines WL1–WLn, a drain connected to a corresponding one of the bit lines BL1–BLn and a source connected to a corresponding one of the fuses F1–Fn.

Referring to FIG. 3, there is shown a detailed circuit diagram of the row address detector 2 in the conventional ROM repair circuit in FIG. 1. As shown in this drawing, the row address detector 2 includes a plurality of fuses F11–F1n and F21–F2n, a PMOS transistor MP1 having a gate connected to a ground, a source connected to a power source voltage Vcc and a drain connected to the fuses F11–F1n and F21–F2n, and a plurality of NMOS transistors MN11–MN1n and MN21–MN2n each having a gate connected to a corresponding one of the addresses A1–An and $\overline{A1}$–$\overline{An}$ applied in the test mode and a drain connected to the drain of the PMOS transistor MP1 via a corresponding one of the fuses F11–F1n and F21–F2n. The error address detect signal EADX is outputted from the drain of the PMOS transistor MP1 when one of the fuses F11–F1n and F21–F2n is cut as a corresponding one of the NMOS transistors MN11–MN1n and MN21–MN2n is driven in response to one of the addresses A1–An and $\overline{A1}$–$\overline{An}$ corresponding to the failed one of the cells in the ROM cell array 1.

The construction of the column address detector 3 is the same as that of the row address detector 2 and a description thereof will thus be omitted.

The operation of the conventional ROM repair circuit with the above-mentioned construction will hereinafter be described.

In the ROM cell array 1, each of the cells stores the information inputted through the corresponding one of the bit lines under the control of the data inputted through the corresponding one of the word lines. During the test mode, a test system which has a predetermined data compares the predetermined data to the information of the ROM cell array 1 in accordance with the addresses A1–An and $\overline{A1}$–$\overline{AN}$. Accordingly, the test system detects the failed cells of the ROM cell array 1 and thus recognizes the addresses A1–An and $\overline{A1}$–$\overline{An}$ of the failed cells. For example, assume that information of a high level must normally be accessed from the cell A. In this case, if information of a low level is accessed from the cell, the cell is regarded as a failed one. In addition, the test system cuts the fuses F11–F2n of the row address detector 4 which correspond to the addresses A1–An and A1–An of the failed cells each having a high level.

Then, the row and column address detectors 2 and 3 detect the row and column addresses corresponding to the failed cell A and generate the error address detect signals EADX and EADY, when one of the addresses of the failed cells is inputted thereto, respectively.

Namely, as shown in FIG. 3, in the row address detector 2, one of the addresses A1–An and $\overline{A1}$–$\overline{An}$ corresponding to the failed cell is applied to the gate of the corresponding one of the NMOS transistors MN11–MN1n and MN21–MN2n. The NMOS transistors MN11–MN1n and MN21–MN2n are driven in response to the applied one of the addresses A1–An and $\overline{A1}$–$\overline{An}$. As a result since the fuses connected to the turned-on NMOS transistors of the NMOS transistors MN11–MN2n are cut, the power source voltage Vcc is outputted as the error address detect signal EADX through the drain of the PMOS transistor MP1. That is, the error address detect signal EADX resulting from the failure of the cell has a high level.

Also, the error address detect signal EADY of a high level is outputted from the column address detector 3 in a similar manner to that in the row address detector 2.

The row and secondary redundancy cell arrays 4 and 5 repair all the information stored in the failed cell in response to the error address detect signals EADX and EADY from the row and column address detectors 2 and 3, respectively. Namely, upon application of the addresses A1–An and $\overline{A1}$–$\overline{An}$, the row and second redundancy cell arrays 4 and 5 repair all the information stored in a cell corresponding to the detected row and column addresses from the row and column address detectors 2 and 3.

However the above-mentioned conventional ROM repair circuit has a disadvantage in that it comprises the redundancy cell arrays to repair all the information stored in the failed cell in response to the detected row and column addresses from the row and column address detectors, resulting in an increase in the size of a chip.

SUMMARY OF THE INVENTION

Therefore, the present invention has been made in view of the above problem, and it is an object of the present invention to provide a ROM repair circuit for replacing an address corresponding to a failed cell with a different address corresponding to a different cell in which is stored the same information as normal information stored in the failed cell prior to the failure, so that the normal information can be accessed from the cell corresponding to the replaced address and the information stored in the failed cell can thus be repaired with no use of separate redundancy cell arrays.

In accordance with the present invention, the above and other objects can be accomplished by a provision of a ROM repair circuit comprising a ROM cell array having a plurality of cells, each of said cells storing information inputted through a corresponding one of a plurality of bit lines under a control of data inputted through a corresponding one of a plurality of word lines; row and column address detection means for detecting row and column addresses corresponding to a failed one of said cells in said ROM cell array from addresses applied in a test mode and generating error address detect signals in accordance with the detected results, respectively; and row and column address conversion means responsive to the error detect signals from said column and row address detection means to replace the row and column addresses corresponding to the failed one of said cells in said ROM cell array with different row and column addresses corresponding to a different one of said cells in said ROM cell array in which is stored the same information as normal information stored in the failed cell prior to the failure.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 4:
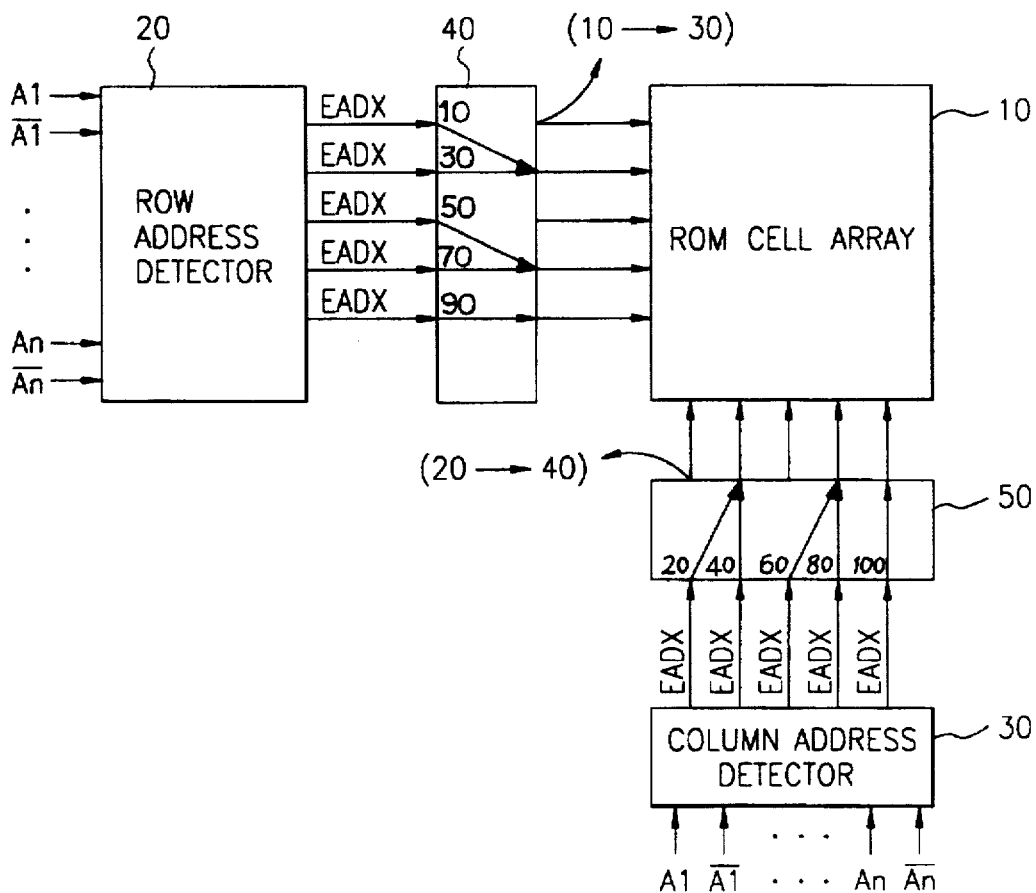
FIG. 4 is a block diagram of a ROM repair circuit of the present invention.

Referring to FIG. 4, there is shown a block diagram of a ROM repair circuit of the present invention. As shown in this drawing, the ROM repair circuit comprises a ROM cell array 10 having a plurality of cells each for storing information inputted through a corresponding one of a plurality of bit lines under a control of data inputted through a corresponding one of a plurality of word lines, a row address detector 20 for detecting a row address corresponding to a failed one of the cells in the ROM cell array 10 and generating an error address detect signal EADX when one of the addresses of the failed cells is inputted thereto and a column address detector 30 for detecting a column address corresponding to the failed one of the cells in the ROM cell array 10 and generating an error address detect signal EADY when one of the addresses of the failed cells is inputted thereto.

A column address converter 40 is responsive to the error address detect signal EADX from the row address detector 20 to replace the row address corresponding to the failed one of the cells in the ROM cell array 10 with a different row address corresponding to a different one of the cells in the ROM cell array 10 in which is stored the same information as normal information stored in the failed cell prior to the failure.

A column address converter 50 is responsive to the error address detect signal EADY from the column address detector 30 to replace the column address corresponding to the failed one of the cells in the ROM cell array 10 with a different column address corresponding to the different one of the cells in the ROM cell array 10 in which is stored the same information as the normal information stored in the failed cell prior to the failure.

Figure 5:
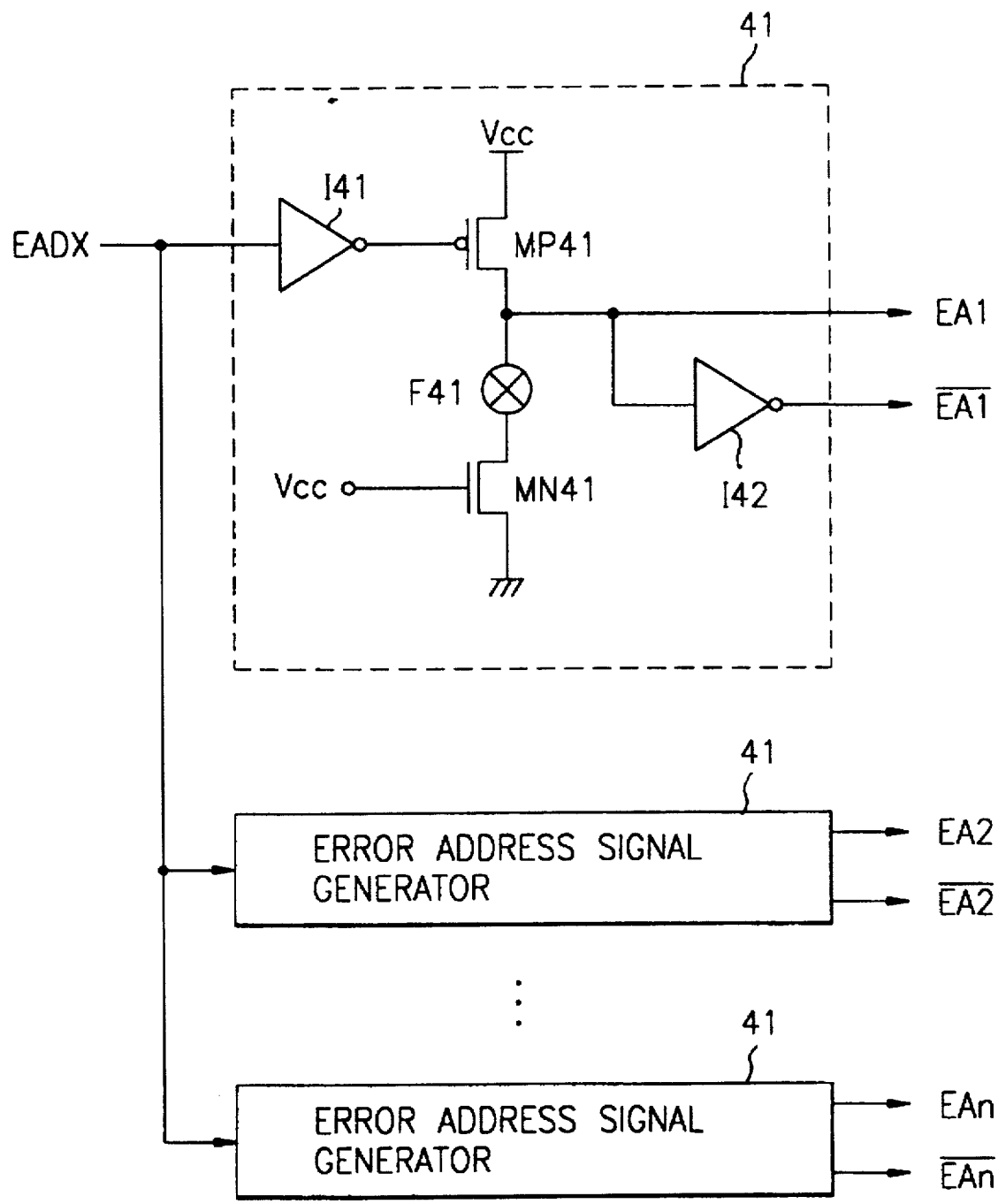
FIG. 5 is a detailed circuit diagram of a row address converter in the ROM repair circuit in FIG. 4.
Figure 6:
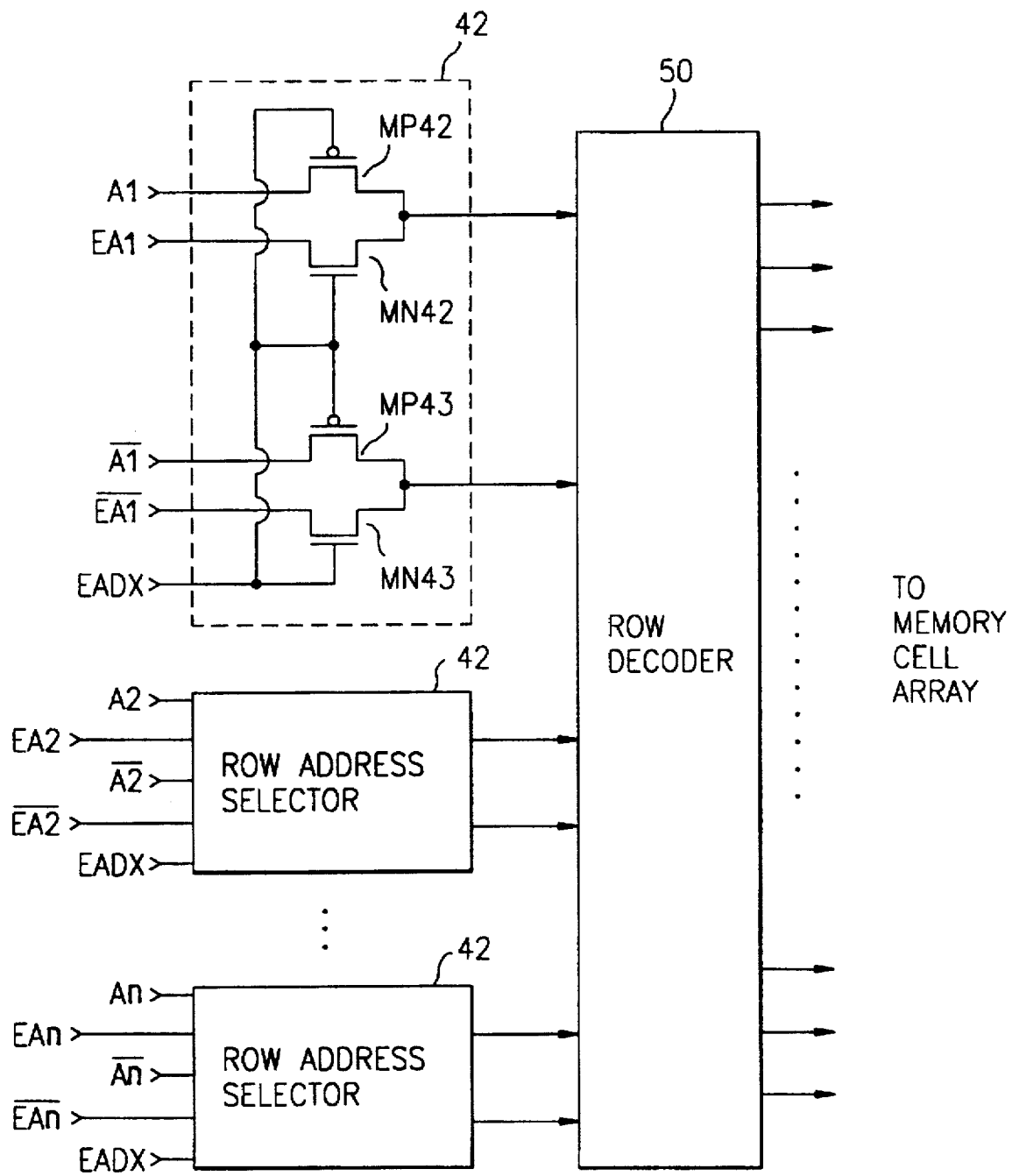
FIG. 6 is a circuit diagram of a row address decoder.

Referring to FIG. 5, there is shown a detailed circuit diagram of the row address converter 40 in the ROM repair circuit in FIG. 4. As shown in this drawing, the row address converter 40 includes a plurality of error address signal generators 41 for generating first and second error address signals EA1 and EAn of the opposite levels in response to the error detect signal EADX from the row address detector 20. As shown in FIG. 6, the row address converter 40 further includes a plurality of row address selectors 42 for selecting one of the first and second error address signals EA41 and $\overline{EAn}$ from the error address signal generators 41 in response to the error address detect signal EADX from the row address detector 20 and outputting the selected error address signal to a row decoder 50 as the row address corresponding to the different one of the cells in the ROM cell array 10 in which is stored the same information as the normal information stored in the failed cell prior to the failure. The row address selectors 42 also receive the addresses A1–An and $\overline{A1-An}$ and apply the inputted addresses A1–An and $\overline{A1-An}$ to the row decoder 50 in response to the error address detect signal EADX.

One of the error address signal generators 41 includes a first inverter I41 for inverting the error address detect signal EADX from the row address detector 20, a PMOS transistor MP41 having a gate connected to an output terminal of the first inverter I41, a source connected to a power source voltage Vcc and a drain for outputting the first error address signal $\overline{EA2}$, and a NMOS transistor MN41 having a gate connected to the power source voltage Vcc, a source connected to a ground and a drain connected to the drain of the PMOS transistor MP41.

The error address signal generator 41 also includes a fuse F41 connected between the drains of the PMOS and NMOS transistors MP41 and MN41 to prevent the first error address signal EA41 from the drain of the PMOS transistor MP41 from being transferred to the drain of the NMOS transistor MN41 and a second inverter I42 for inverting the first error address signal $\overline{EA2}$ from the drain of the PMOS transistor MP41 and outputting the inverted signal as the second error address signal $\overline{EA1}$.

One of the row address selectors 42 includes a PMOS transistor MP42 having a gate for inputting the error address detect signal EADX from the column address detector 20, a source for inputting the address A1 and a drain connected to the row decoder 50 for outputting the address A1 thereto when the PMOS transistor MP42 is turned on, a NMOS transistor MN42 having a gate for inputting the error address detect signal EADX a drain for inputting the first error address signal $\overline{EA1}$ from the error address signal generator 41 and a source connected to the decoder 50 and to the drain of the PMOS transistor MP42 for outputting the first error address signal $\overline{EA1}$ thereto when the PMOS transistor MP42 is turned on, therefore a PMOS transistor MP43 having a gate connected to the gate of the NMOS transistor MN42 for inputting the error address detect signal EADX, a source for inputting the inverted address $\overline{A1}$, a drain connected to the row decoder 50 for outputting the inverted address $\overline{A1}$ to the row decoder 50 when the PMOS transistor MP43 is turned on, a NMOS transistor MN43 having a gate for inputting the error address detect signal EADX, a drain for inputting the second error address signal $\overline{EA1}$, a source connected to the row decoder 50 and to the drain of the PMOS transistor MP43 for outputting the second error address signal $\overline{EA1}$ to the row decoder 50 when the NMOS transistor MN43 is turned on. In addition, other row address selectors 42 input the error address detect signal EADX, the corresponding addresses A2–An and $\overline{A2-An}$, and the corresponding first and second error address signals EA2–EAn and $\overline{EA2-EAn}$, and are constructed as that of the above-mentioned row address selector 42.

The construction of the column address converter 50 is the same as that of the row address converter 40 and a description thereof will thus be omitted.

The operation of the ROM repair circuit with the above-mentioned construction in accordance with the present invention will hereinafter be described in detail.

Figure 1:
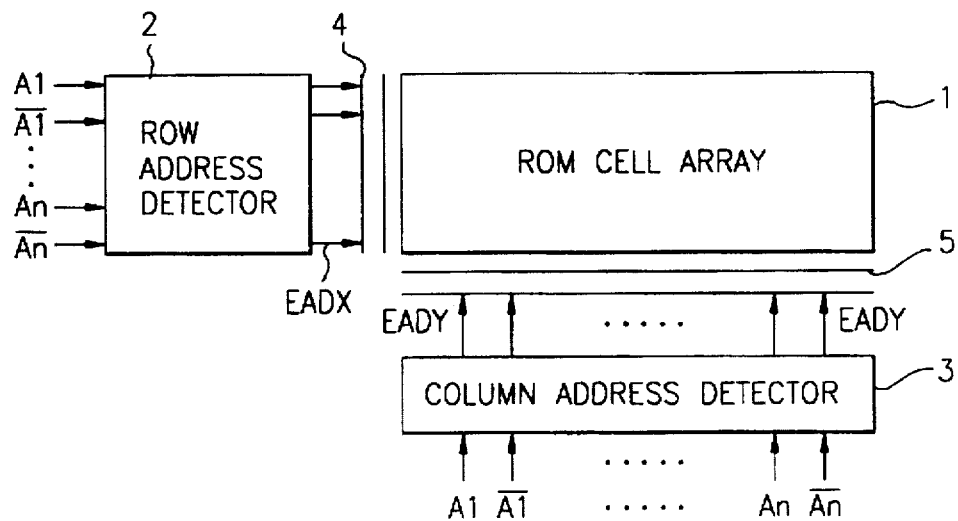
FIG. 1 is a block diagram of a conventional ROM repair circuit.
Figure 2:
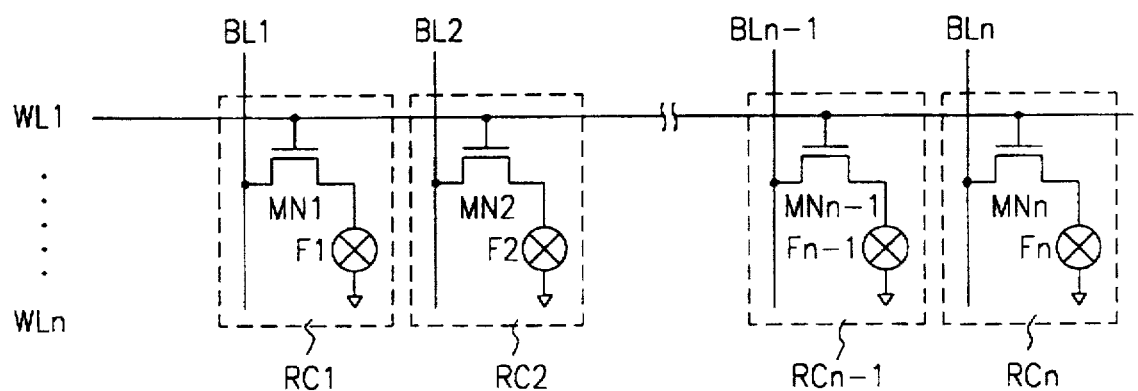
FIG. 2 is a detailed circuit diagram of a redundancy cell array in the conventional ROM repair circuit in FIG. 1.
Figure 3:
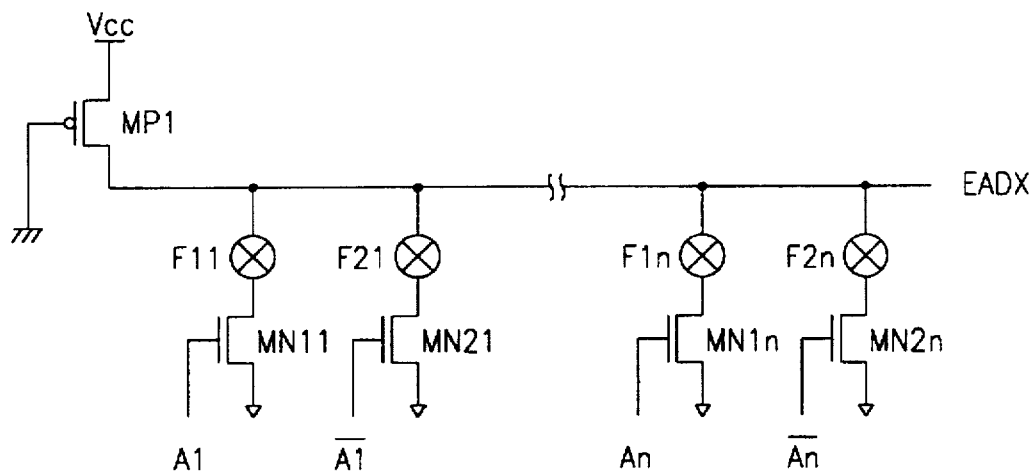
FIG. 3 is a detailed circuit diagram of a row address detector in the conventional or present repair circuit in FIG. 1.

In the ROM cell array 10, each of the cells stores the information inputted through the corresponding one of the bit lines BL1–BLn under the control of the data inputted through the corresponding one of the word lines WL1–WLn. For example, assume that a failure will take place at one of the cells in the ROM cell array 10 corresponding to the 10th row address and the 20th column address and information of a high level must normally be accessed from the corresponding cell. In this case, if information of a low level is accessed from the cell corresponding to the 10th row address and the 20th column address, the corresponding cell is regarded as a failed one. Then, the fuses F11–F21 (see FIG. 3) corresponding to the address of the failed cell is cut using an electricity or a laser.

Then, the row and column address detectors 20 and 30 detect the row and column addresses corresponding to the failed cell and generate the error detect signals EADX and EADY by cutting ones of fuses F11–F1n and F21–F2n (see FIG. 3) corresponding to the detected row and column addresses, respectively.

The error detect signals EADX and EADY from the row and column address detectors 20 and 30 are applied to the row and column address converters 40 and 50, respectively, so that the 10th row address and the 20th column address can be replaced with different row and column addresses corresponding to a different cell having the information of the low level.

For example, provided that the information of the low level is stored in a cell corresponding to the 30th row address and the 40th column address, the 10th row address and the 20th column address are replaced with the 30th row address and the 40th column address. Then, the replaced 30th row address and 40th column address are applied to the ROM cell array 10.

Namely, as shown in FIG. 5, in the error address signal generator 41 of the row address converter 40, the error detect signal EADX from the row address detector 20 is inverted by the first inverter I41 into a low level since it has a high level upon the cell failure. The low-inverted error detect signal $\overline{EADX}$ from the first inverter I41 is applied to the gate of the PMOS transistor MP41, thereby causing the PMOS transistor MP41 to be turned on. As turned on, the PMOS transistor MP41 outputs the first error address signal EA2 of a high level through its drain. The first error address signal EA2 of the high level from the drain of the PMOS transistor MP41 is also inverted into a low level by the second inverter I42. As a result, the low-inverted first error address signal $\overline{EA1}$ is outputted from the second inverter I42 as the second error address signal.

At this time, the NMOS transistor MN41 is electrically isolated from the PMOS transistor MP41 by cutting the fuse F41 using an electricity or a laser. The error address signal generators 41 output the first and second error address signals EA1–EAn and $\overline{EA1-EAn}$ respectively of the high and low levels which correspond to the address of the cell storing the same information as the failed cell. On the other hand, the error address signal generators 41 output the first and second error address signals EA1–EAn and $\overline{EA1-EAn}$ respectively of the low and high levels when the error address detect signal EADX is low, that is, the address of a normal cell is inputted to the row address detector 20.

Then, in the row address selector 42, the first and second error address signals EA1 and $\overline{EA1}$ of the high and low levels from the error address signal generator 41 are applied to the drains of the NMOS transistors MN43 and MN42, respectively. Here, one of the first and second error address signals EA1 and $\overline{EA1}$ is selected as the row address to be replaced, on the basis of the error detect signal EADX from the row address detector 20. Namely, since the error address detect signal EADX is high, the NMOS transistors MN42 and MN43 are turned on, thereby causing the first and second error address signals $\overline{EA1}$ and EA1 respectively of the high and the low level to be selected while the addresses A1 and $\overline{A1}$ are selected and outputted to the row decoder 50 when the error address detect signal EADX is low. In the same manner, other row address selectors 42 select the addresses A2–An and $\overline{A2-An}$ or the first and second error address signals EA2–EAn and $\overline{EA2-EAn}$ in accordance with the error address detect signal EADX. As a result, the 10th row address is replaced with the 30th row address corresponding to the cell in which the information of the low level is stored. The row decoder 50 decodes the signals from the row address selectors 42, and outputs the decoded signals for enabling a word line connected to the memory cell array 10.

On the other hand, the error address detect signal EADY from the column address detector 30 is applied to the column address converter 50. In a similar manner to that in the row address converter 40, the column address converter 50 replaces the 20th column address with the 40th column address corresponding to the cell in which the information of the low level is stored.

Therefore, in the ROM cell array 10, the normal information can be accessed from the cell corresponding to the 30th row address and the 40th column address instead of the failed cell corresponding to the 10th row address and the 20th column address.

As apparent from the above description, according to the present invention, the information stored in the failed cell can be repaired with no use of separate redundancy parts. This results in a reduction in the size of a chip. Also, the repair of only the abnormal information in the failed cell has the effect of reducing the processing time.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ROM repair circuit comprising:

a ROM cell array having a plurality of cells, each of said plurality of cells storing information;

row and column address detection means for detecting row and column addresses corresponding to a defective cell of said plurality of cells in said ROM cell array and generating error address detect signals when the row and addresses of the defective cell are inputted thereto, respectively; and row and column address conversion means for converting the row and column addresses corresponding to the defective cell of said plurality of cells in said ROM cell array into row and column addresses corresponding to a different one of said plurality of cells in said ROM cell array in which is stored the same information as normal information stored in the defective cell prior to the failure, wherein each of said row and column address conversion means includes a plurality of error address signal generation means for generating first and second error address signals in response to the error address detect signals, a plurality of address selection means for selecting the row and column addresses or the first and second error address signals from the error address signal generation means in accordance with the corresponding error address detect signals.

2. The ROM repair circuit of claim 1, wherein said row address conversion means includes:

a plurality of the error address signal generation means for inputting the error address detect signal from said row address detection means and generating first and second error address signals of the opposite levels in accordance with a state of a fuse therein; and a plurality of the row address selection means for transmitting the row addresses or the first and second error address signals from the error address signal generation means to a row decoder in accordance with a predetermined level of the error address detect signal, wherein the row decoder is electrically connected to the ROM cell array and decodes signals from the row address selection means in order to generate the row address corresponding to the different one of said plurality of cells in said ROM cell array in which is stored the same information as the normal information stored in the defective cell prior to the failure.

3. The ROM repair circuit of claim 2, wherein said error address signal generation means include:

a first inverter for inverting the error address detect signal from said row address detection means;

a PMOS transistor having a gate connected to an output terminal of said first inverter, a source connected to a power source voltage and a drain for outputting the first error address signal;

a NMOS transistor having a gate connected to the power source voltage, a source connected to a ground and a drain connected to the drain of said PMOS transistor;

a fuse connected between the drains of said PMOS and NMOS transistors to prevent the first error address signal from the drain of said PMOS transistor from being transferred to the drain of said NMOS transistor; and a second inverter for inverting the first error address signal from the drain of said PMOS transistor and outputting the inverted signal as the second error address signal.

4. The ROM repair circuit of claim 2, wherein said row address selection means includes:

a first PMOS transistor having a gate for inputting the error address detect signal from said row address detection means, a source for inputting the row address and a drain for outputting the row address to the row decoder when the first PMOS transistor is turned on;

a first NMOS transistor having a gate for inputting the error address detect signal from said row address detection means, a drain for inputting the first error address signal from said error address signal generation means and a source for outputting the first error address signal inputted through the drain of the first NMOS transistor as the row address to the row decoder when the first NMOS transistor is turned on;

a second PMOS transistor having a gate for inputting the error address detect signal from said row address detection means, a source for inputting an inverted row address and a drain for outputting the inverted row address as the row address to the row decoder when the second PMOS transistor is turned on; and a second NMOS transistor having a gate for inputting the error address detect signal from said row address detection means, a drain for inputting the second error address signal from said error address signal generation means and a source for outputting the second error address signal inputted through the drain of the second NMOS transistor as the row address to the row decoder when the second NMOS transistor is turned on.

* * * * *